US009374545B2

(12) United States Patent
Fowler et al.

(10) Patent No.: US 9,374,545 B2
(45) Date of Patent: Jun. 21, 2016

(54) AMPLIFIER ADAPTED FOR CMOS IMAGING SENSORS

(71) Applicant: BAE Systems Imaging Solutions, Inc., Nashua, NH (US)

(72) Inventors: Boyd Fowler, Sunnyvale, CA (US); Hung Do, San Jose, CA (US); Xinqiao Liu, Mountain View, CA (US)

(73) Assignee: BAE Systems Imaging Solutions Inc., Milpitas, CA (US)

( * ) Notice: Subject to any disclaimer, the term of this patent is extended or adjusted under 35 U.S.C. 154(b) by 137 days.

(21) Appl. No.: 14/026,855

(22) Filed: Sep. 13, 2013

(65) Prior Publication Data

US 2015/0076321 A1  Mar. 19, 2015

(51) Int. Cl.
*H04N 5/3745* (2011.01)
*H03F 3/16* (2006.01)
*H03F 3/08* (2006.01)

(52) U.S. Cl.
CPC .............. *H04N 5/3745* (2013.01); *H03F 3/082* (2013.01); *H03F 3/16* (2013.01)

(58) Field of Classification Search
CPC ....... H04N 3/14; H04N 5/335; H04N 5/3745; H03F 3/16; H03F 3/082
USPC ................ 250/208.1, 214 R, 214 LA, 214 A, 250/214 LS, 214 SW; 348/300, 301, 302, 348/304, 308; 330/84, 98, 294
See application file for complete search history.

(56) References Cited

U.S. PATENT DOCUMENTS

| 2001/0012070 | A1* | 8/2001 | Enod et al. ..................... 348/302 |
| 2002/0066848 | A1* | 6/2002 | Fowler ................... H04N 5/361 |
| | | | 250/208.1 |

FOREIGN PATENT DOCUMENTS

| EP | 0657863 | 7/2003 |
| WO | 87/06711 | 11/1987 |
| WO | 01/51894 | 7/2001 |
| WO | 03/010495 | 2/2003 |
| WO | 2010/018706 | 2/2010 |

* cited by examiner

*Primary Examiner* — Georgia Y Epps
*Assistant Examiner* — Don Williams
(74) *Attorney, Agent, or Firm* — Calvin B. Ward

(57) ABSTRACT

A column readout amplifier and imaging array using the same method are disclosed. The column readout amplifier includes a signal amplifier having an amplifier signal output, a first filter capacitor, a buffer amplifier having a buffer amplifier input and a buffer amplifier output, and a switching network. The switching network connects the amplifier signal output to the buffer amplifier input and the buffer amplifier output to the first filter capacitor during a first time period, and connects the amplifier signal output directly to the first filter capacitor during a second time period. The time periods can be of fixed duration or determined by the difference in potential between the input and output of the buffer amplifier. The column readout amplifier can be used in an imaging array to readout columns of pixels.

14 Claims, 5 Drawing Sheets

AMPLIFIER ADAPTED FOR CMOS IMAGING SENSORS

BACKGROUND OF THE INVENTION

CMOS image sensors that are designed to operate at low illumination levels require very low noise readout circuits. A CMOS imaging sensor typically consists of a two-dimensional array of pixel sensors arranged as a plurality of rows and columns. Each pixel sensor includes a photodiode and a readout circuit that converts the charge accumulated by the photodiode during the image exposure to a voltage that is readout by a readout amplifier that is typically shared by all of the pixel sensors in a column. The pixel sensors in each row are readout in parallel using the column readout amplifiers. To maintain low noise, the time between the transfer of the photocharge to the readout circuits in the pixel sensors and the readout of that charge must be as small as possible, since noise accumulates in the pixel sensors during this phase.

To limit the noise in the column readout amplifiers, a low bandwidth amplifier is typically utilized. The lower the bandwidth of the amplifier, the lower the readout noise from the amplifier. However, lowering the bandwidth of the readout amplifier results in an increase in the time required to readout the pixel currently attached to the readout amplifier, since the reduced bandwidth amplifier takes longer to settle. Hence, there is a tradeoff between readout time and readout noise. Accordingly, reducing the noise in the column readout amplifiers remains a challenge in low light sensors.

SUMMARY OF THE INVENTION

The present invention includes a column readout amplifier and method for using the same. The column readout amplifier includes a signal amplifier having an amplifier signal output, a first filter capacitor, a buffer amplifier having a buffer amplifier input and a buffer amplifier output, and a switching network. The switching network connects the amplifier signal output to the buffer amplifier input and the buffer amplifier output to the first filter capacitor during a first time period, and connects the amplifier signal output directly to the first filter capacitor during a second time period.

In one aspect of the invention, the signal amplifier charges the first filter capacitor with a first time constant when directly connected to the first filter capacitor. The first time period is less than five times the first time constant.

In another aspect of the invention, the column readout amplifier switches from the first time period to the second time period when the buffer amplifier input and the buffer amplifier output differ by less than a predetermined threshold. In another aspect of the invention, the first and second time periods are fixed in duration.

The column readout amplifier is adapted for use in an imaging array that includes a bit line conductor, a plurality of pixel sensors, each pixel sensor is coupled to the bit line conductor in response to a word select signal, and a column readout amplifier according to the present invention.

DETAILED DESCRIPTION OF THE PREFERRED EMBODIMENTS OF THE INVENTION

Figure 1:
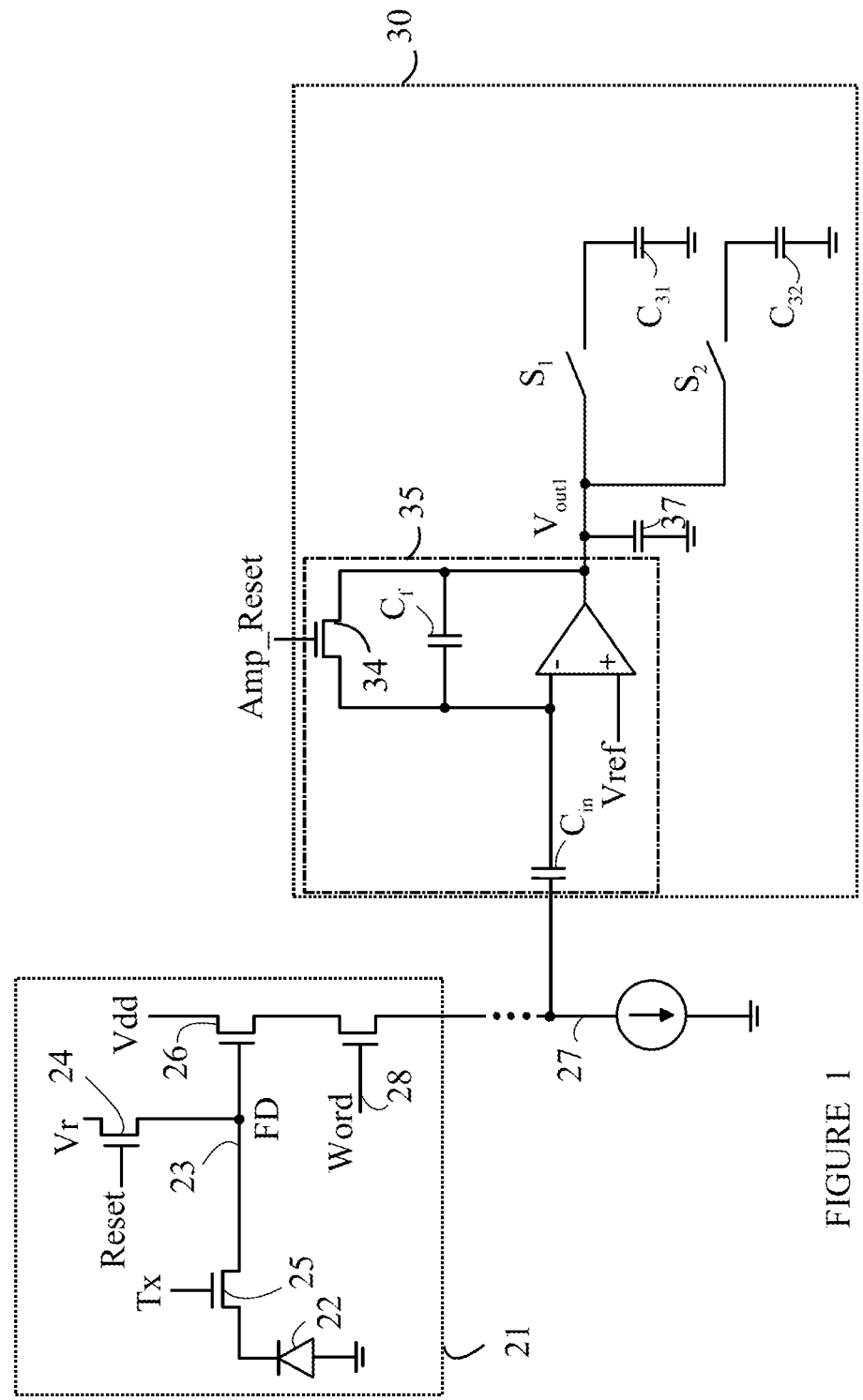
FIG. 1 illustrates a prior art readout amplifier connected to one pixel sensor in a column of pixel sensors.

The manner in which the present invention provides its advantages can be more easily understood with reference to FIG. 1, which illustrates a prior art column readout amplifier 30 connected to one pixel sensor in a column of pixel sensors. The particular pixel sensor that is connected to bit line 27 is determined by the signal on a corresponding word line 28. Pixel sensor 21 typically includes a photodiode 22 that accumulates charge during the image exposure. At the end of the image exposure, floating diffusion node 23 is reset to Vr by closing gate 24 using a signal on a reset line. The voltage on floating diffusion node 23 after the reset operation is measured via source follower 26 and column readout amplifier 30 is stored on in a sample and hold circuit on capacitor $C_{31}$ in column readout amplifier 30.

After this voltage measurement, gate 25 is placed in a conducting state in response to a signal on Tx. The positive potential on floating diffusion node 23 causes all of the charge on photodiode 22 to be transferred to floating diffusion node 23. The transferred charge results in a decrease in the potential of floating diffusion node 23 relative to the reset potential. The potential on floating diffusion node 23 is then measured by column readout amplifier 30 and stored in the sample and hold circuit on capacitor 32. The difference in voltage on capacitors 31 and 32 is then used to determine the charge that was generated by photodiode 22 during the exposure.

Figure 2:
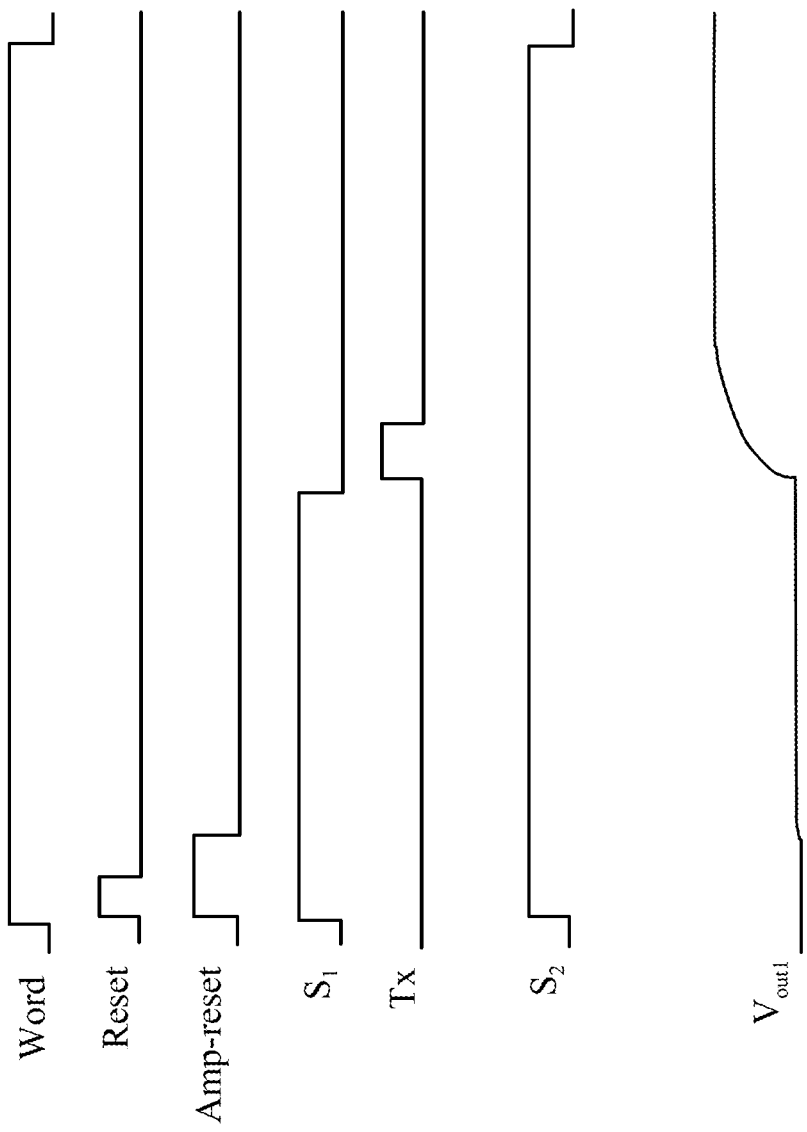
FIG. 2 illustrates a timing diagram for the readout of the pixel shown in FIG. 1 via a conventional readout amplifier.

Refer now to FIG. 2, which is a timing diagram for the readout of the pixel shown in FIG. 1 via a conventional readout amplifier. Column readout amplifier 30 typically includes a capacitive transimpedance amplifier 35 constructed from $C_{in}$ and a feedback capacitor $C_f$. Prior to measuring the voltage on bit line 27, the input and output of capacitive transimpedance amplifier 35 are shorted by closing switch 34. The gain of capacitive transimpedance amplifier 35 is the ratio of the capacitances of capacitors $C_{in}$ and $C_f$, which is typically of the order of 30. Capacitor 37 sets the bandwidth of capacitive transimpedance amplifier 35. Increasing capacitor 37 reduces the noise in the voltage measurements, since capacitor 37 sets the time constant of a low pass filter. However, the time for the output of capacitive transimpedance amplifier 35 to stabilize is also determined by capacitor 37, since capacitive transimpedance amplifier 35 must charge capacitor 37. This slow rise time limits the speed with which the pixels can be readout.

The present invention reduces the readout time of the column amplifier while using a large filter capacitor by providing a higher charging current for the capacitor during the earlier portion of the charging cycle for the filter capacitor. Once the potential on the capacitor is near its final value, the additional charging current is removed and the column readout amplifier is allowed to finish the charging operation. Since the potential on the filter capacity is near its final value when the additional amplification is removed, the time to settle to its final value is reduced, and hence, a larger capacitor can be utilized without increasing the readout time.

Figure 3:
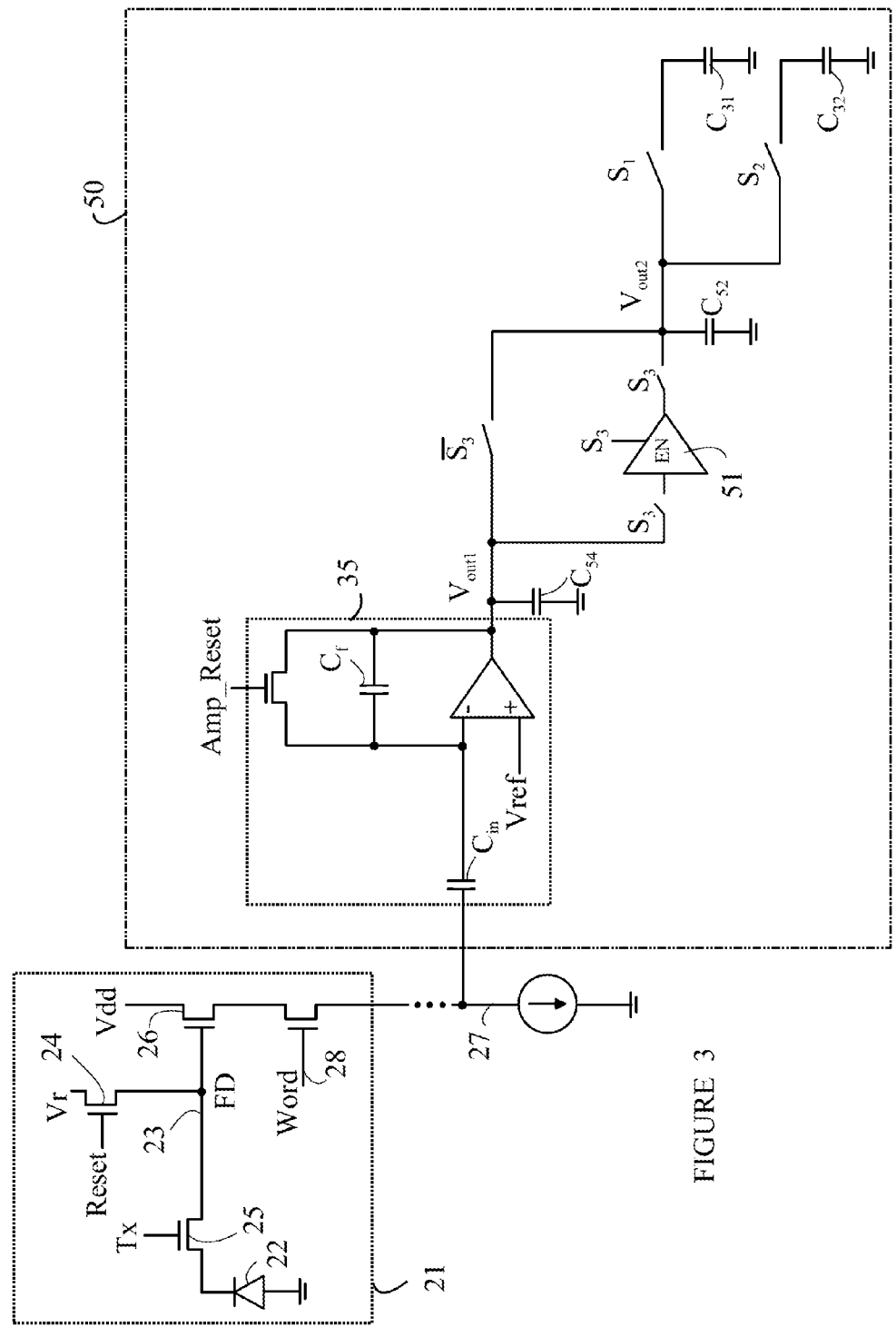
FIG. 3 is a schematic drawing of a column readout amplifier according to the present invention.
Figure 4:
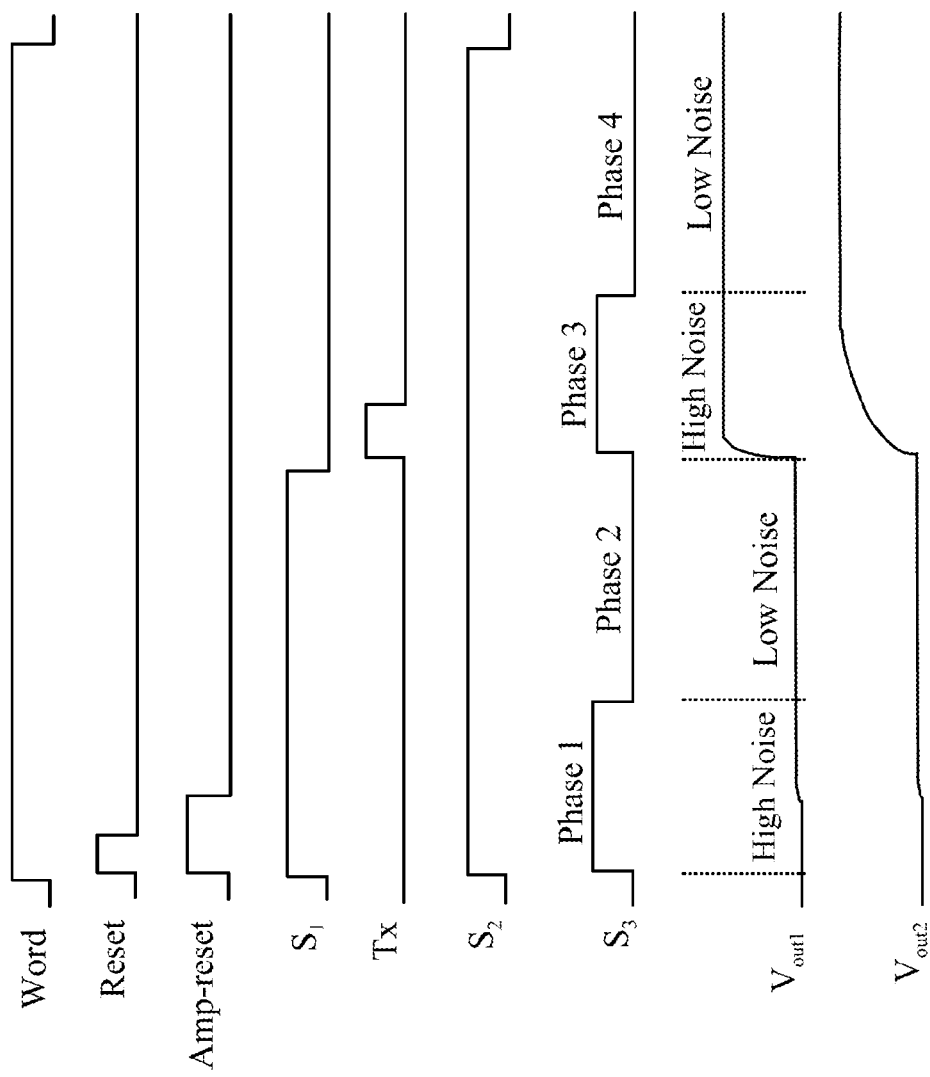
FIG. 4 is a timing diagram for the various signals shown in FIG. 3.

Refer now to FIGS. 3 and 4. FIG. 3 is a schematic drawing of a column readout amplifier 50 according to the present invention, and FIG. 4 is a timing diagram for the various signals shown in FIG. 3. To simplify the following discussion, those elements of column readout amplifier 50 that serve functions analogous to those shown in FIG. 2 for column readout amplifier 30 have been given the same numerical designations and will not be discussed further here. In column readout amplifier 50, capacitor $C_{52}$ serves the function of the filter capacitor 37 in FIG. 1; however, the capacitance of $C_{52}$ is several times larger than that of capacitor 37. A readout operation using column readout amplifier 50 can be viewed as occurring in two phases. In the first phase, the voltage to be measured is transferred to $C_{in}$ and the switches operated by $S_3$ are closed. To simplify the drawing, the controller that generates the $S_3$ signal and its connections to the various switches have been omitted. As a result, $V_{out1}$, the output of capacitive transimpedance amplifier 35, is routed to a buffer amplifier 51 which charges capacitor $C_{52}$. Buffer amplifier 51 has a gain of one, and hence, the voltage on capacitor $C_{52}$ follows $V_{out1}$. However, the noise levels at $V_{out2}$ are considerably higher than those in $V_{out1}$ because of the high current gain. It should also be noted that the time for $V_{out1}$ to reach equilibrium is significantly reduced in column readout amplifier 50 because capacitor $C_{54}$ is much smaller than capacitor 37 in column readout amplifier 30.

At the end of the first phase, the voltage on $C_{52}$2, $V_{out2}$, will be nearly $V_{out1}$. The differences in voltage will be the result of the increased noise from buffer amplifier 51 and any small differences in the gain of the buffer amplifier relative to the ideal gain of one. In general, the gain of buffer amplifier 51 is set to be substantially equal to one. The amount by which the gain can differ from one depends on the degree of mismatch of the potential on capacitor $C_{52}$ that can be tolerated. Any mismatch results in an increase in the time needed for capacitor $C_{52}$ to reach $V_{out1}$ after $S_3$ is opened. The amount of additional time that is required to reach equilibrium will, in general, depend on the specific application. An improvement over the prior art is obtained if the equilibrium time is less than that required in the absence of buffer amplifier 51.

During the second phase, the switches operated by $S_3$ are opened and buffer amplifier 51 is disconnected. The output of capacitive transimpedance amplifier 35 is hence connected directly to capacitor $C_{52}$. Any differences in voltage between $V_{out1}$ and $V_{out2}$ will then be eliminated by capacitive transimpedance amplifier 35. In addition, the noise level at capacitor $C_{52}$ will be that characterized by the sum of the capacitances of capacitors $C_{52}$ and $C_{54}$.

Figure 5:
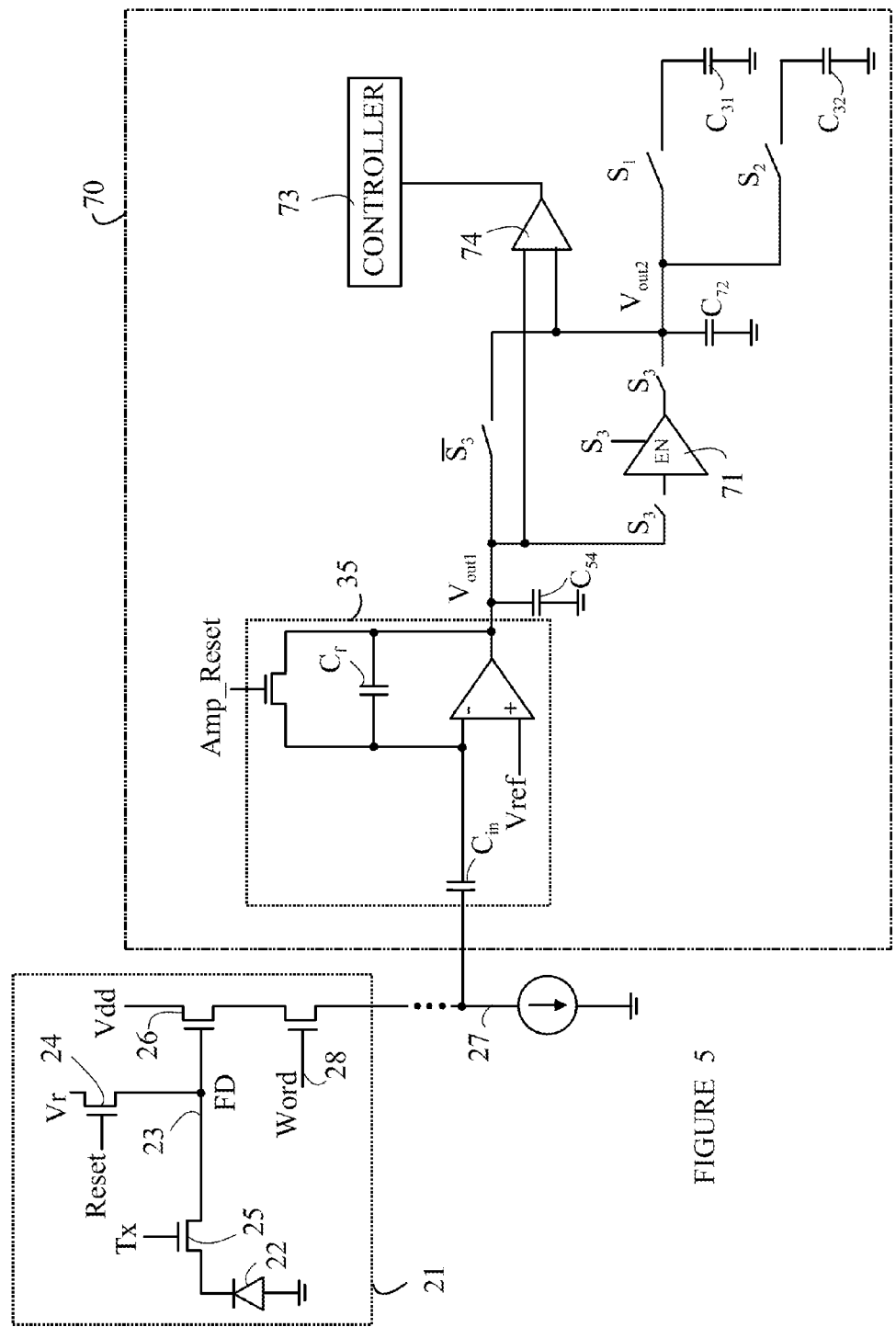
FIG. 5 illustrates an embodiment of the present invention that utilizes a higher gain amplifier to accelerate the charging of the filter capacitor.

In the above-described embodiments, a unit gain buffer amplifier is used to accelerate the charge rate of the filter capacitor during the first phase of the readout. However, embodiments in which a higher gain factor is utilized together with a comparator to accelerate the charging of the filter capacitor can also be constructed. Refer now to FIG. 5, which illustrates an embodiment of the present invention that utilizes a higher gain amplifier to accelerate the charging of the filter capacitor. To simplify the following discussion, those elements of column readout amplifier 70 that provide functions analogous to functions discussed above with respect to FIG. 3, have been given the same numeric designations and will not be discussed in detail here. In column readout amplifier 70, amplifier 71 charges filter capacitor $C_{72}$ during the first phase of the readout operation. The gain of amplifier 71 is greater than one to further accelerate the initial charging of filter capacitor $C_{72}$. A comparator 74 monitors the voltage difference between the output of capacitive transimpedance amplifier 35 and filter capacitor $C_{72}$. When the monitored voltage difference is less than a predetermined threshold value, a switch controller 73 changes the state of the $S_3$ signal such that amplifier 71 is no longer connected to filter capacitor $C_{72}$. The final charging of filter capacitor $C_{72}$ is then provided by capacitive transimpedance amplifier 35 to provide lower noise in a time that is significantly less than the time required to charge filter capacitor $C_{72}$ to the final output voltage of capacitive transimpedance amplifier 35 without the precharging via amplifier 71. When the voltage has stabilized on capacitor $C_{72}$, controller 73 closes one of the sample switches to capture the voltage on capacitor $C_{72}$ on a corresponding one of the sample and hold capacitors, $C_{31}$ or $C_{32}$.

It should also be noted that the comparator arrangement shown in FIG. 5 could also be utilized in embodiments with a unit gain buffer amplifier. In the above described embodiments that utilize a unit gain amplifier, the duration of the phases is set by predetermined time values. However, a comparator arrangement similar to that shown in FIG. 5 could also be utilized with a unit gain amplifier to determine the time at which the column readout amplifier switches between the first and second phases. This arrangement can provide a reduced readout time, or lower noise by allowing a larger filter capacitor to be used. However, such embodiments require additional transistors to implement the comparator, and hence, can pose challenges if the available space for the column readout amplifiers is limited. In this regard, it should be noted that an imaging array may have thousands of such column readout amplifiers, and hence, even a few transistors per column readout amplifier can represent a significant increase in the cost of the imaging array.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
   a signal amplifier having an amplifier signal output;
   a first filter capacitor;
   a buffer amplifier having a buffer amplifier input and a buffer amplifier output; and
   a switching network,
   wherein said first filter capacitor has first and second terminals, said second terminal being connected to ground, and said switching network connects said amplifier signal output to said buffer amplifier input by a first direct current path and said buffer amplifier output to said first terminal of said first filter capacitor by a second direct current path during a first time period, and connects said amplifier signal output directly to said first terminal of said first filter capacitor by a third direct current path during a second time period.

2. The apparatus of claim 1 wherein said signal amplifier charges said first filter capacitor with a first time constant when directly connected to said first filter capacitor and wherein said first time period is less than five times said first time constant.

3. The apparatus of claim 1 wherein said buffer amplifier has a gain substantially equal to one.

4. The apparatus of claim 1, wherein said apparatus further comprises a controller that measures a difference between said buffer amplifier input and buffer amplifier output, said controller causing said apparatus to switch from said first time period to said second time period when said difference is less than a predetermined threshold.

5. The apparatus of claim 1 wherein said first time period and said second time period are fixed.

6. The apparatus of claim 1 wherein said buffer amplifier output is disconnected from said first filter capacitor during said second time period.

7. The apparatus of claim 1 wherein said signal amplifier comprises a capacitive transimpedance amplifier with a gain greater than one.

8. The apparatus of claim 1 wherein said first filter capacitor is characterized by a first filter capacitor capacitance and said signal amplifier comprises a second filter capacitor, characterized by a second filter capacitor capacitance, said second filter capacitor being connected to said amplifier signal output, said second filter capacitor capacitance being less than five times said first filter capacitor capacitance.

9. An imaging array comprising:
a bit line conductor;
a plurality of pixel sensors, each pixel sensor being coupled to said bit line conductor in response to a word select signal;
a column amplifier connected to said bit line conductor, said column amplifier comprising:
a signal amplifier having an amplifier signal output;
a first filter capacitor;
a buffer amplifier having a buffer amplifier input and a buffer amplifier output; and
a switching network,
wherein said first filter capacitor has first and second terminals, said second terminal being connected to ground, and said switching network connects said amplifier signal output to said buffer amplifier input by a first direct current path and said buffer amplifier output to said first terminal of said first filter capacitor by a second direct current path during a first time period, and connects said amplifier signal output directly to said first terminal of said first filter capacitor by a third direct current path during a second time period.

10. The imaging array of claim 9 wherein said first amplifier charges said first filter capacitor with a first time constant when directly connected to said first filter capacitor and wherein said first time period is less than five times said first time constant.

11. The imaging array of claim 9 wherein said buffer amplifier output is disconnected from said first filter capacitor during said second time period.

12. The imaging array of claim 9 wherein said signal amplifier comprises a capacitive transimpedance amplifier with a gain greater than one.

13. The imaging array of claim 9 wherein said first filter capacitor is characterized by a first filter capacitor capacitance and said signal amplifier comprises a second filter capacitor, characterized by a second filter capacitor capacitance, said second filter capacitor being connected to said signal amplifier output, said second filter capacitor capacitance being less than five times said first filter capacitor capacitance.

14. The imaging array of claim 9, wherein said first filter capacitor is characterized by a first filter capacitor capacitance and wherein said imaging array further comprises a sample and hold circuit comprising a sample switch and a hold capacitor, said sample switch connecting said first filter capacitor to said hold capacitor in response to a control signal, said hold capacitor being characterized by a capacitance less than five times said first filter capacitor capacitance.

* * * * *